United States Patent
Lin

(10) Patent No.: US 6,784,735 B2
(45) Date of Patent: Aug. 31, 2004

(54) HIGH SWITCHING SPEED DIFFERENTIAL AMPLIFIER

(75) Inventor: Wei-Cheng Lin, Kaohsiung (TW)

(73) Assignee: Frontend Analog and Digital Technology Corporation, Taipei (TW)

( * ) Notice: Subject to any disclaimer, the term of this patent is extended or adjusted under 35 U.S.C. 154(b) by 0 days.

(21) Appl. No.: 10/414,092

(22) Filed: Apr. 16, 2003

(65) Prior Publication Data

US 2003/0227327 A1 Dec. 11, 2003

(30) Foreign Application Priority Data

Jun. 7, 2002 (TW) .......................................... 91112480 A

(51) Int. Cl.[7] .............................. H03F 3/45; H03K 17/04
(52) U.S. Cl. ........................................ 330/253; 327/374
(58) Field of Search ................................ 330/252, 253, 330/277; 327/328, 359, 374

(56) References Cited

U.S. PATENT DOCUMENTS 5,821,809 A * 10/1998 Boerstler et al. ............ 330/253
RE36,013 E * 12/1998 Lee ............................. 330/253
6,369,652 B1 * 4/2002 Nguyen et al. .............. 330/253

* cited by examiner

Primary Examiner—Khanh Van Nguyen
(74) Attorney, Agent, or Firm—Rosenberg, Klein & Lee

(57) ABSTRACT

A high switching speed differential amplifier comprises a differential pair, a first and a second active loads, and a current source, in which the differential pair is composed of a pair of MOS transistors to receive a pair of differential signals from a first and a second inputs. The first active load is connected to an output of the first MOS transistor and includes a first and a second paths switched therebetween in response to the first input. The second active load is connected to an output of the second MOS transistor and includes a third and a fourth paths in response to the second input.

10 Claims, 3 Drawing Sheets

HIGH SWITCHING SPEED DIFFERENTIAL AMPLIFIER

FIELD OF THE INVENTION

The present invention relates generally to a differential amplifier, and more particularly to a high switching speed differential amplifier and the amplification method thereof.

BACKGROUND OF THE INVENTION

In the driver circuit design for laser diodes, it is required a gain stage capable of providing large current driving and high switching speed. FIG. 1 shows a basic scheme 10 of a driver circuit for laser diodes, which includes a front-end gain stage 14 and a modulation stage 16. The gain stage 14 is inputted a pseudo emitter coupling logic (PECL) signal 12, and its output is connected to the modulation stage 16. For the large capacitive delay effect in the modulation stage 16, the gain stage 14 is employed to amplify the pseudo emitter coupling logic signal 12 to improve the system.

Current gain stage 14 usually utilizes traditional differential amplifier. FIG. 2 shows a traditional differential amplifier 34, which comprises three parts, a first and a second passive loads 70a and 70b, a differential pair 72, and a current source 74. The first and second passive loads 70a and 70b are constructed with resistors 18 and 20 connected to a first and a second supply voltages 46 and 48, respectively. The differential pair 72 is composed of a pair of NMOS transistors 26 and 28 with their gates to receive a pair of differential input signals 36 and 38, respectively, also shown by $V_{in+}$ and $V_{in-}$ in FIG. 2. The outputs of the NMOS transistors 26 and 28 are connected to the resistors 18 and 20 through nodes 22 and 24, respectively. The current source 74 is composed of an NMOS transistor 20 with its gate biased, source connected to ground 32, and drain connected to the differential pair 72. The operation of the differential amplifier 34 is briefly described in the following. Once the gates of the NMOS transistors 26 and 28 receive the differential voltage signals 36 and 38, the differential pair 72 transforms them to a current flowing through the resistor 18 from the drain current of the NMOS transistor 26. Resulted from the small signal module, it is obtained a voltage gain $G_m \times R_d$, where $G_m$ is the transconductance of the differential pair 72 and $R_d$ is the resistance of the resistor 18. To improve the switching speed of the differential amplifier 34, the resistance $R_d$ of the resistor 18 must be low, while that also reduces the voltage gain $G_m \times R_d$ at the same time. If the resistance $R_d$ of the resistor 18 is increased to obtain larger voltage gain $G_m \times R_d$, the larger resistor 18 will lower the frequency response and slow down the switching speed. In other words, the traditional differential amplifier 34 cannot provide high voltage gain and high switching speed at the same time. Hence, it is desired a differential amplifier with high amplification gain and high switching speed.

SUMMARY OF THE INVENTION

Accordingly, one object of the present invention is to disclose a differential amplifier to provide high gain and high switching speed at the same time.

In a differential amplifier, according to the present invention, there is included a differential pair, a current source connected to the differential pair, and two active loads connected to the differential pair. The differential pair is composed of a pair of MOS transistors to receive a pair of differential signals from two inputs. Each of the active loads includes a pair of MOS transistors, among which one active load is connected to an output of one MOS transistor in the differential pair and forms two paths switched therebetween in response to one of the inputs of the differential pair, and another active load is connected to an output of the other MOS transistor in the differential pair and forms third and fourth paths switched therebetween in response to another input of the differential pair.

BRIEF DESCRIPTION OF THE DRAWINGS

The above and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
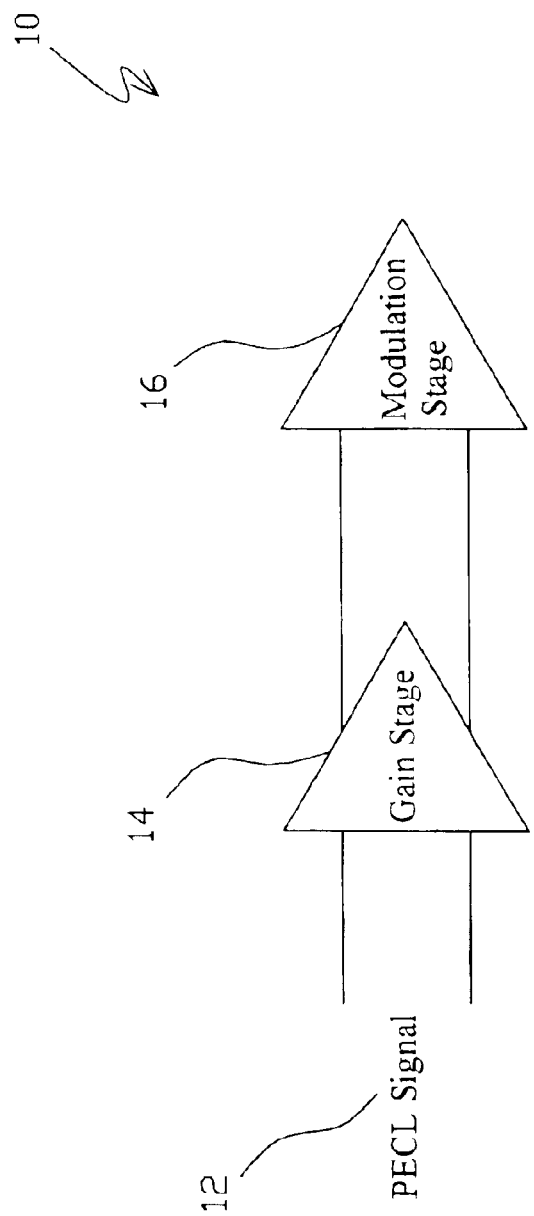
FIG. 1 shows a basic scheme of a driver circuit for laser diodes.
Figure 2:
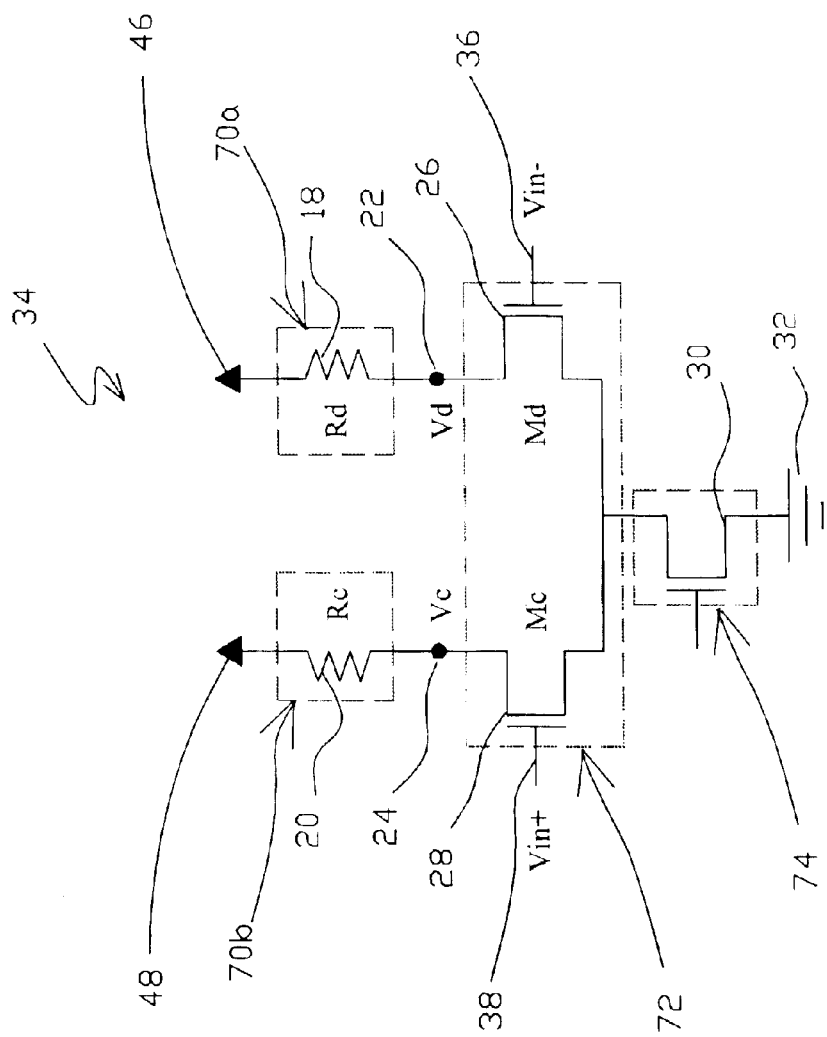
FIG. 2 shows a traditional differential amplifier circuit.
Figure 3:
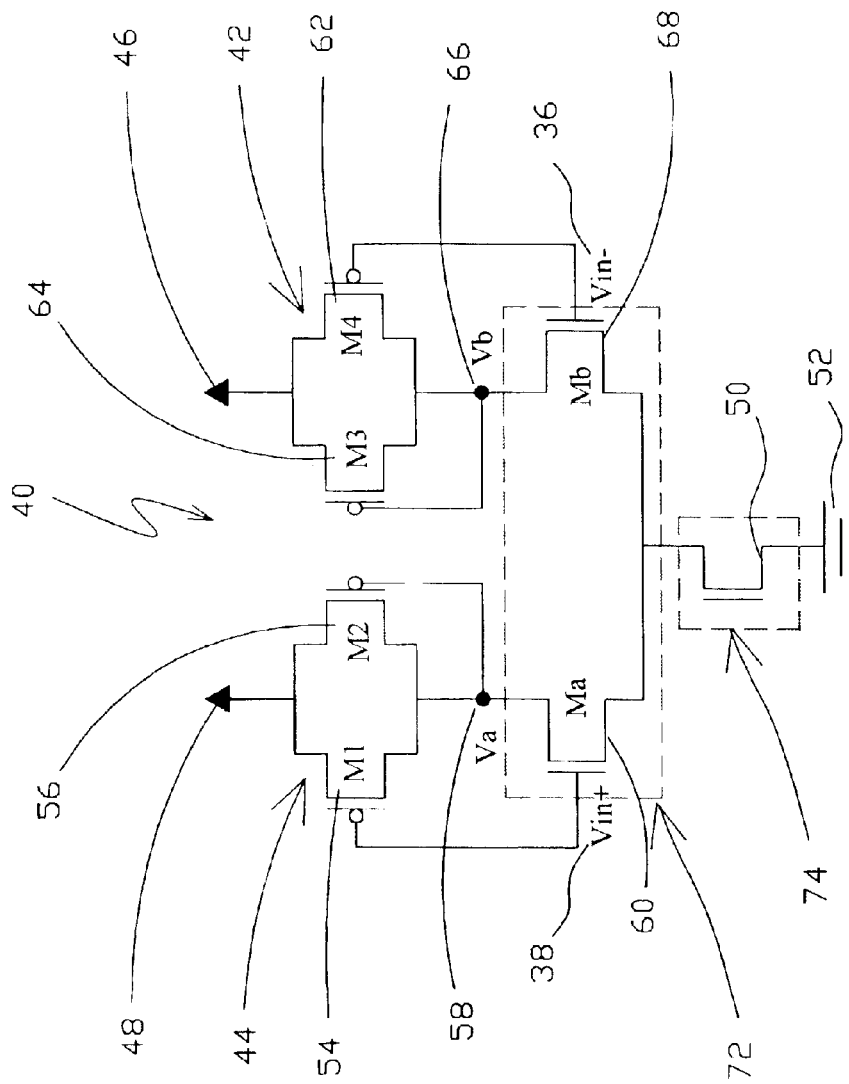
FIG. 3 shows a preferred embodiment of the present invention.

In a preferred embodiment of the present invention, as shown in FIG. 3, a differential amplifier 40 is constructed by incorporating a pair of PMOS transistors 54 and 56 as the first active load 44 and another pair of PMOS transistors 62 and 64 as the second active load 42. The sources of the PMOS transistors 54 and 56 in the first active load 44 are connected together to a supply voltage 48, their drains are connected together to the node 58, and the gate of the PMOS transistor 56 is also connected to the node 58. On the other hand, the sources of the PMOS transistors 62 and 64 in the second active load 42 are connected together to a supply voltage 46, their drains are connected together to the node 66, and the gate of the PMOS transistor 64 is also connected to the node 66. The outputs of the NMOS transistors 60 and 68 in the differential pair 72 are connected to the nodes 58 and 66, respectively, and their gates are connected to the gates of the PMOS transistors 54 and 62 and a pair of differential input signals 36 and 38, respectively. The current source 74 includes a biased NMOS transistor 50, its drain is connected to the sources of the NMOS transistors 60 and 68 in the differential pair 72, and its source is connected to ground 52.

The operation principle of the differential amplifier 40 is described as below. Supplying the pair of differential input signals 36 and 38 to the gates of the NMOS transistors 60 and 68 in the differential pair 72, supposed that the input signal 36 is a high level voltage and the other input signal 38 is a low level voltage, the NMOS transistor 60 will be turned on. Due to the gate of the PMOS transistor 54 connected with the gate of the NMOS transistor 60, the PMOS transistor 54 is turned off at the time the NMOS transistor 60 is turned on. Before the NMOS transistor 60 is turned on, the PMOS transistor 54 is conductive and the PMOS transistor 56 is not, and, as a result, the voltage of the node 58 is at high level. On the instant of the NMOS transistor 60 is turned on, the PMOS transistor 56 is still at off state, the node 58 can thus be treated as at low level at the time the NMOS transistor 60 is turning on. Therefore, the voltage of the node 58 arrives low level rapidly in an indirect manner, and the voltage transient of the gain stage is speeded-up, thereby resulting in faster response in the modulation stage 16 or other circuit behind the gain stage.

In the above-mentioned embodiment, the differential amplifier 40 employs active loads 44 and 42 for the NMOS transistors 60 and 68, respectively, in the differential pair 72, and each of the active loads 44 or 42 includes two paths under controlled to be switched therebetween, of which each path has a PMOS transistor. When the input 38 or 36 of the differential pair 72 is switched from high level to low level, or from low level to high level, the corresponding active load can immediately switch one path to reduce the transient period of the differential amplifier 40 in the transfer process. With the invented differential amplifier 40, the traditional differential amplifier 34 or other front-end gain stage 14 can be replaced without additional circuit introduced. If the differential amplifier 40 is applied to the driver circuit 10 of laser diodes, high switching speed and high voltage gain are obtained simultaneously, and the large capacitive delay effect in the rear-end modulation stage 16 is overcome.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A high switching speed differential amplifier comprising:
    a differential pair composed of a first and a second MOS transistors for being connected with a pair of differential signals from a first and a second inputs, respectively;
    a current source provided for the differential pair;
    a first active load connected to an output of the first MOS transistor and including a first and a second paths switched therebetween in response to the first input; and
    a second active load connected to an output of the second MOS transistor and including a third and a fourth paths switched therebetween in response to the second input.

2. The differential amplifier of claim 1, wherein the first, second, third and forth paths include a third, a fourth a fifth and a sixth MOS transistors, respectively.

3. The differential amplifier of claim 2, wherein the third and fourth MOS transistors are connected in parallel and have their gates connected to the first input and the output of the first MOS transistor, respectively.

4. The differential amplifier of claim 2, wherein the fifth and sixth MOS transistors are connected in parallel and have their gates connected to the output of the second MOS transistor and the second input, respectively.

5. The differential amplifier of claim 2, wherein the first and second MOS transistors are of a first conductivity type, and the third, fourth, fifth, and sixth MOS transistors are of a second conductivity type opposite to the first conductivity type.

6. The differential amplifier of claim 1, wherein the current source includes a biased MOS transistor.

7. A high switching speed differential amplification method for amplifying a pair of differential signals from a first and a second inputs, the method comprising the steps of:
    connecting the first and second inputs to inputs of a first and a second MOS transistors, respectively, in a differential pair; and
    connecting a third and a fourth MOS transistors to the output of the first MOS transistor and a fifth and a sixth MOS transistors to the output of the second MOS transistor;
    wherein the third and fourth MOS transistors are switched therebetween in response to the first input, and the fifth and sixth MOS transistors are switched therebetween in response to the second input.

8. The method of claim 7, further comprising the step of connecting the third and fourth MOS transistors in parallel and the fifth and sixth MOS transistors in parallel.

9. The method of claim 8, further comprising the step of connecting the first and second inputs to inputs of the third and fifth MOS transistors, respectively.

10. The method of claim 9, further comprising the step of connecting an input of the fourth MOS transistor with an output of the first MOS transistor and an input of the sixth MOS transistor with an output of the second MOS transistor.

* * * * *